(12) United States Patent
Wuu et al.

(10) Patent No.: US 7,417,260 B2
(45) Date of Patent: Aug. 26, 2008

(54) MULTIPLE-CHROMATIC LIGHT EMITTING DEVICE

(76) Inventors: Dong-Sing Wuu, No. 50, Alley 30, Lane 107, Mei-Tsun S. Rd., Nan Dist., Taichung (TW); Ray-Hua Horng, No. 50, Alley 30, Lane 107, Mei-Tsun S. Rd., Nan Dist., Taichung (TW)

( * ) Notice: Subject to any disclaimer, the term of this patent is extended or adjusted under 35 U.S.C. 154(b) by 285 days.

(21) Appl. No.: 11/169,565

(22) Filed: Jun. 28, 2005

(65) Prior Publication Data

US 2006/0289890 A1    Dec. 28, 2006

(51) Int. Cl.
*H01L 29/20* (2006.01)
*H01L 29/22* (2006.01)

(52) U.S. Cl. ............... 257/89; 257/81; 257/88; 257/98; 257/99

(58) Field of Classification Search ........... 257/79–103, 257/E33.056, E33.057, E33.058
See application file for complete search history.

(56) References Cited

U.S. PATENT DOCUMENTS 7,045,375 B1 *    5/2006    Wu et al. ............... 438/35

* cited by examiner

*Primary Examiner*—Hung Vu
(74) *Attorney, Agent, or Firm*—Ladas & Parry, LLP

(57) ABSTRACT

A light emitting device includes: a first LED that emits a first primary light in a first primary wavelength range when activated; a second LED that emits a second primary light in a second primary wavelength range when activated, the second primary wavelength range differing from the first primary wavelength range; and a semiconductor photon-recycling member associated with the first LED in such a manner to convert a portion of the first primary light into a secondary light in a secondary wavelength range through photon-recycling mechanism and to permit the remainder of the first primary light to pass therethrough. The secondary wavelength range is different from the first and second primary wavelength ranges, thereby enabling the light emitting device to emit a multiple-chromatic light.

9 Claims, 2 Drawing Sheets

MULTIPLE-CHROMATIC LIGHT EMITTING DEVICE

BACKGROUND OF THE INVENTION

1. Field of the Invention

This invention relates to a light emitting device, more particularly to a light emitting device having at least two light emitting diodes (LEDs) and a photon-recycling member that converts a primary light emitted from one of the LEDs into a secondary light for emitting a multiple-chromatic light.

2. Description of the Related Art

U.S. Pat. No. 5,851,063 discloses a conventional lighting system that uses three LEDs, which emit lights in the wavelength ranges from 455 to 490 nm (blue light), 530 to 570 nm (green light), and 605 to 630 nm (red light), respectively, as a light source for emitting a trichromatic white light. The lighting system is disadvantageous in that the driving voltage of the red light LED is different from those of the blue light LED and the green light LED. As a consequence, two different circuits are required for the red and blue or green light LEDs, respectively, which complicates the lighting system and results in an increase in the manufacturing costs. In addition, when one of the three LEDs breaks down, particularly, when the red light LED breaks down, the lighting system can no longer emit white light.

Another conventional lighting system uses a blue light LED or a UV LED in combination with a fluorescent material for emitting white light. However, the luminous efficacy of the lighting system is greatly reduced by the fluorescent material. Moreover, the fluorescent material tends to deteriorate after a period of use.

Conventional photon recycling LEDs include an LED bonded to a wafer containing an active region which absorbs photons of a primary light emitted from the LED and remits a secondary light through photon recycling mechanism. However, the conventional photon recycling LEDs can only emit a complementary white light (a combination of blue light and yellow light) and cannot be fit well with the blue, green, and red color filters for serving as a light source in a backlight module of a liquid crystal display.

SUMMARY OF THE INVENTION

The object of the present invention is to provide a light emitting device that is capable of overcoming the aforesaid drawbacks of the prior art.

Accordingly, there is provided a light emitting device for emitting a multiple-chromatic light. The light emitting device comprises: a first LED that emits a first primary light in a first primary wavelength range when activated; a second LED that emits a second primary light in a second primary wavelength range when activated, the second primary wavelength range differing from the first primary wavelength range; and a semiconductor photon-recycling member associated with the first LED in such a manner to convert a portion of the first primary light into a secondary light in a secondary wavelength range through photon-recycling mechanism and to permit the remainder of the first primary light to pass therethrough. The secondary wavelength range is different from the first and second primary wavelength ranges, thereby enabling the light emitting device to emit a multiple-chromatic light.

BRIEF DESCRIPTION OF THE DRAWINGS

Other features and advantages of the present invention will become apparent in the following detailed description of the preferred embodiments of the invention, with reference to the accompanying drawings, in which.

DETAILED DESCRIPTION OF THE PREFERRED EMBODIMENTS

Figure 1:
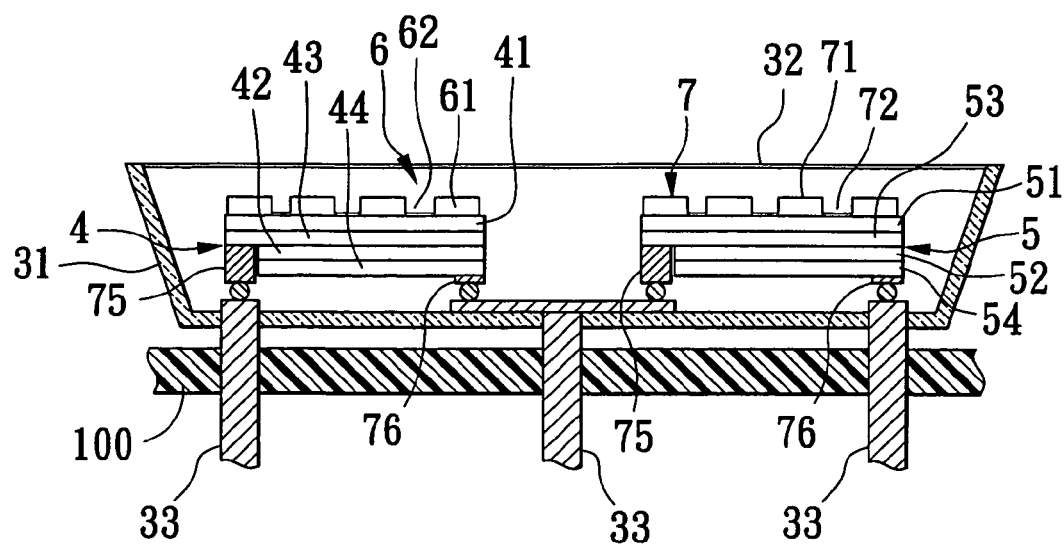
FIG. 1 is a fragmentary sectional view of the first preferred embodiment of a light emitting device according to this invention.

Before the present invention is described in greater detail, it should be noted that same reference numerals have been used to denote like elements throughout the specification.

FIG. 1 illustrates the first preferred embodiment of a light emitting device for emitting a multiple-chromatic light according to this invention.

The light emitting device comprises: a first LED 4 that emits a first primary light in a first primary wavelength range when activated; a second LED 5 that emits a second primary light in a second primary wavelength range when activated, the second primary wavelength range differing from the first primary wavelength range; and a semiconductor first photon-recycling member 6 associated with the first LED 4 in such a manner to convert a portion of the first primary light into a first secondary light in a first secondary wavelength range through photon-recycling mechanism and to permit the remainder of the first primary light to pass therethrough. The first secondary wavelength range is different from the first and second primary wave length ranges, thereby enabling the light emitting device to emit a multiple-chromatic light.

In this embodiment, the first primary wavelength range is from 390 to 505 nm (i.e., blue light), the second primary wavelength range is from 505 to 575 nm (i.e., green light), and the first secondary wavelength range is from 575 to 780 nm (i.e., red light) so as to enable the light emitting device to emit white light.

Preferably, the light emitting device further includes a semiconductor second photon-recycling member 7 associated with the second LED 5 in such a manner to convert a portion of the second primary light into a second secondary light in a second secondary wavelength range through photon-recycling mechanism and to permit the remainder of the second primary light to pass therethrough. The second secondary wavelength range is from 585 to 780 nm (i.e., red light).

The first LED 4 includes a first active layer 42 that emits the first primary light and that is made from a first semiconductor material selected from the group consisting of InGaN, AlGaN, AlGaInN, and ZnSSe. The first photon-recycling member 6 includes a first photon-recycling layer 61 that is bonded to the first LED 4, that emits the first secondary light, and that is made from a second semiconductor material selected from the group consisting of GaInP, AlGaInP and AlGaAs.

The second LED 5 includes a second active layer 52 that is bonded to the second LED 5, that emits the second primary light, and that is made from the first semiconductor material. The second photon-recycling member 7 includes a second photon-recycling layer 71 that emits the second secondary light and that is made from the second semiconductor material.

Each of the first and second LEDs 4, 5 further includes a transparent substrate 41 (51), a n-type cladding layer 43 (53) formed on the substrate 41 (51), and a p-type cladding layer 44(54). Each of the first and second active layers 42, 52 is sandwiched between the n-type cladding layer 43 (53) and the p-type cladding layer 44(54) of the respective one of the first and second LEDs 4, 5. Each of the first and second photon-recycling layers 61, 71 is bonded to the substrate 41 (51) of the respective one of the first and second LEDs 4, 5.

Each of the first and second LEDs 4, 5 is provided with first and second electrodes 75, 76 that are formed on the n-type cladding layer 43 (53) and the p-type cladding layer 44 (54), respectively.

The first and second LEDs 4, 5 are mounted in a cup-shaped base 31 having a top open end 311 that is provided with a transparent cover 32 covering the top open end 311 of the cup-shaped base 31.

A circuit board 100 is electrically coupled to the first and second electrodes 75, 76 of the first and second LEDs 4, 5 through conductive terminals 33 for providing a driving voltage to the first and second LEDs 4, 5. The first and second LEDs 4, 5 are in the form of solder-bumped flip chips.

Figure 2:
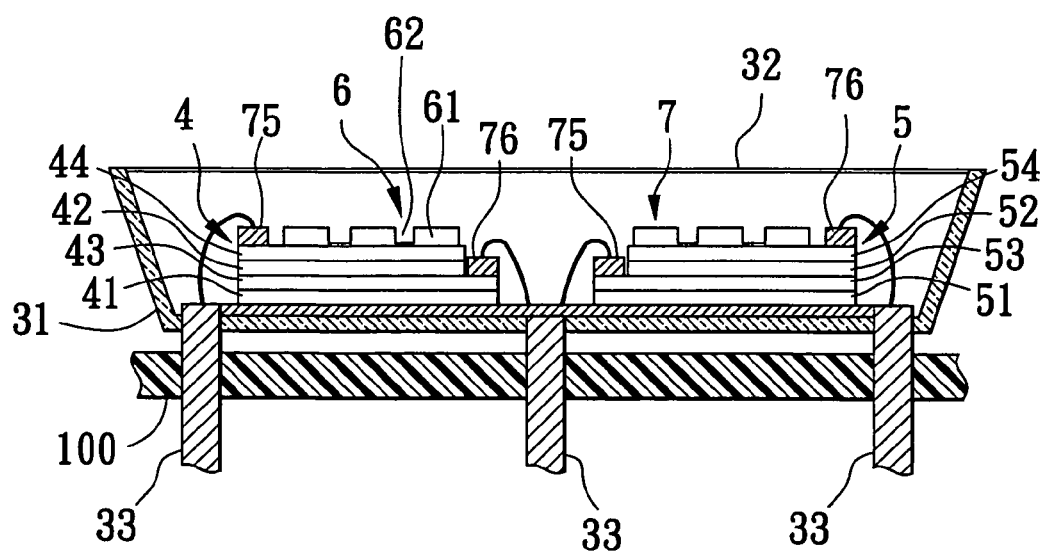
FIG. 2 is a fragmentary sectional view of the second preferred embodiment of a light emitting device according to this invention.

FIG. 2 illustrates the second preferred embodiment of the light emitting device according to this invention. The light emitting device of this embodiment differs from the previous embodiment in that each of the first and second photon-recycling layers 61, 71 is bonded to the p-type cladding layer 44 (54) of the respective one of said first and second LEDs 4, 5, and that the first and second LEDs 4, 5 are in the form of wire-bonding chips.

Figure 3:
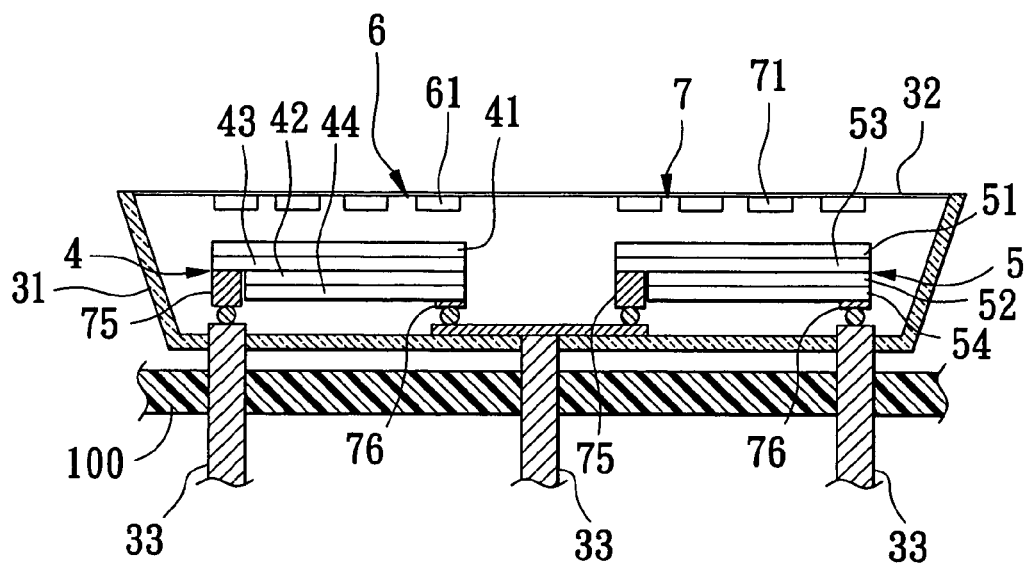
FIG. 3 is a fragmentary sectional view of the third preferred embodiment of a light emitting device according to this invention.

FIG. 3 illustrates the third preferred embodiment of the light emitting device according to this invention. The light emitting device of this embodiment differs from the first embodiment in that the first and second photon-recycling layers 61, 71 are bonded to the cover 32 and are respectively aligned with the first and second LEDs 4, 5. Attachment of the first and second photon-recycling layers 61, 71 to the cover 32 has advantages, such as lower manufacturing costs, ease of assembly, and much higher yield, as compared to that of the previous embodiment, which involves bonding to the substrate 41 (51) or the p-type cladding layer 44 (54).

Figure 4:
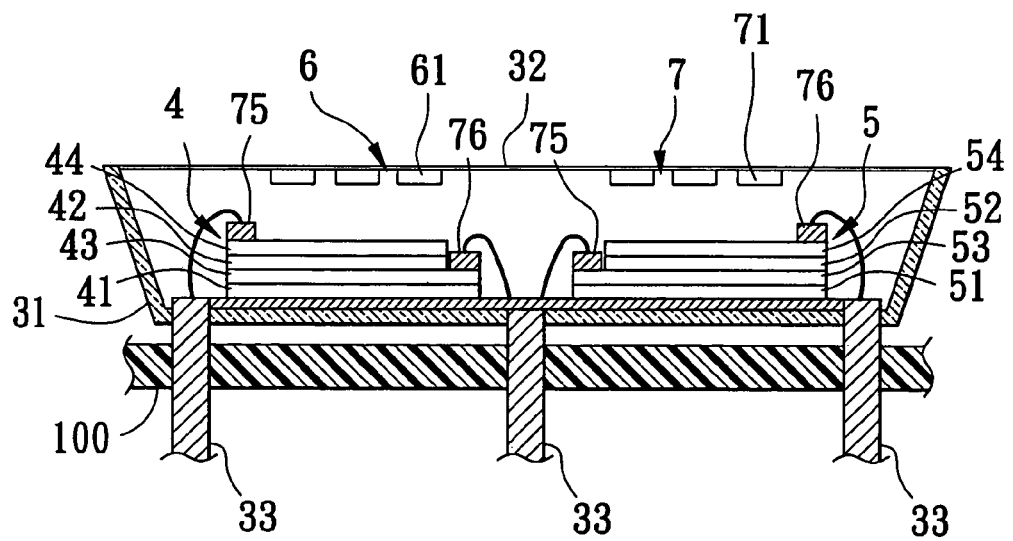
FIG. 4 is a fragmentary sectional view of the fourth preferred embodiment of a light emitting device according to this invention.

FIG. 4 illustrates the fourth preferred embodiment of the light emitting device according to this invention. The light emitting device of this embodiment differs from the second embodiment in that the first and second photon-recycling layers 61, 71 are bonded to the cover 32 and are respectively aligned with the first and second LEDs 4, 5.

Each of the first and second photon-recycling layers 61, 71 in the preferred embodiments is formed with a plurality of recesses 62 (72) for passage of the remainder of the respective one of the first and second primary lights therethrough. The recesses 62 (72) in each of the first and second photon-recycling layers 61, 71 have an area percentage ranging from 1 to 20% based on the total area of the respective one of the first and second photon-recycling layers 61, 71 so as to result in a substantially pure white light.

In addition, when the light emitting device of this invention includes only one of the first and second LEDs 4, 5 mounted in the cup-shaped base 31, by adjusting the area percentage of the recesses 62 (72), the light emitting device can emit a dichromatic light with a desired color.

With the inclusion of at least one of the first and second photon-recycling members 6, 7, which reemits a secondary light by absorbing the primary light of a respective one of the first and second LEDs 4, 5, in the light emitting device of this invention, and by designing a predetermined area percentage of the recesses 62, 72, the light emitting device can emit a trichromatic white light and can thus serve as a light source for a backlight module of a liquid crystal display.

While the present invention has been described in connection with what is considered the most practical and preferred embodiments, it is understood that this invention is not limited to the disclosed embodiments but is intended to cover various arrangements included within the spirit and scope of the broadest interpretations and equivalent arrangements.

What is claimed is:

1. A light emitting device for emitting a multiple-chromatic light, comprising:
    a cup-shaped base having a top open end;
    a transparent cover covering said top open end of said cup-shaped base;
    a first light emitting diode (LED) that is mounted in said cup-shaped base and that emits a first primary light in a first primary wavelength range when activated;
    a second light emitting diode (LED) that is mounted in said cup-shaped base and that emits a second primary light in a second primary wavelength range when activated, said second primary wavelength range differing from said first primary wavelength range;
    a semiconductor first photon-recycling member bonded to the cover and associated with said first LED in such a manner to convert a portion of the first primary light into a first secondary light in a first secondary wavelength range through photon-recycling mechanism and to permit the remainder of the first primary light to pass therethrough, said first photon-recycling member being aligned with the first LED; and
    a semiconductor second photon-recycling member bonded to the cover and associated with said second LED in such a manner to convert a portion of the second primary light into a second secondary light in a second secondary wavelength range through photon-recycling mechanism and to permit the remainder of the second primary light to pass therethrough, said second photon-recycling member being aligned with the second LED;
    wherein said first secondary wavelength range is different from said first and second primary wavelength ranges, thereby enabling said light emitting device to emit the multiple-chromatic light.

2. The light emitting device of claim 1, wherein said first primary wavelength range is from 390 to 505 nm, said second primary wavelength range is from 505 to 575 nm, and said first secondary wavelength range is from 575 to 780 nm so as to enable said light emitting device to emit white light.

3. The light emitting device of claim 2, wherein said second secondary wavelength range is from 585 to 780 nm.

4. The light emitting device of claim 1, wherein said first LED includes a first active layer that emits the first primary light and that is made from a first semiconductor material selected from the group consisting of InGaN, AlGaN, AlGaInN, and ZnSSe, said first photon-recycling member including a first photon-recycling layer that emits the first secondary light and that is made from a second semiconductor material selected from the group consisting of GaInP, AlGaInP and AlGaAs.

5. The light emitting device of claim 4, wherein said second LED includes a second active layer that emits the second primary light and that is made from said first semiconductor material, said second photon-recycling member including a second photon-recycling layer that emits the second secondary light and that is made from said second semiconductor material.

6. The light emitting device of claim 5, wherein each of said first and second photon-recycling layers is formed with a plurality of recesses for passage of the respective one of the first and second primary lights therethrough.

7. The light emitting device of claim 6, wherein said recesses in each of said first and second photon-recycling layers have an area percentage ranging from 1 to 20% based on the total area of the respective one of said first and second photon-recycling layers.

8. A light emitting device comprising:
a cup-shaped base having a top open end;
a transparent cover covering said top open end of said cup-shaped base;
a light emitting diode (LED) that is mounted in said cup-shaped base and that emits a primary light in a primary wavelength range when activated; and
a semiconductor photon-recycling layer bonded to said cover and associated with said LED in such a manner to convert a portion of the primary light into a secondary light in a secondary wavelength range through photon-recycling mechanism, said photon-recycling layer being aligned with said LED;
wherein said primary and secondary wavelength ranges are discrete; and
wherein said photon-recycling layer is formed with a plurality of recesses for passage of the remainder of the primary light therethrough.

9. The light emitting device of claim 8, wherein said LED includes an active layer that emits the primary light and that is made from a first semiconductor material selected from the group consisting of InGaN, AlGaN, AlGaInN, and ZnSSe, said photon-recycling layer being made from a second semiconductor material selected from the group consisting of GaInP, AlGaInp and AlGaAs.

* * * * *